United States Patent [19]
Ling et al.

[11] Patent Number: 5,894,423
[45] Date of Patent: Apr. 13, 1999

[54] DATA PROCESSING SYSTEM HAVING AN AUTO-RANGING LOW VOLTAGE DETECTION CIRCUIT

[75] Inventors: David Ling, Austin; Lloyd Paul Matthews, Buda; Thomas Lovell Portlock; Edward John Hathaway, both of Austin, all of Tex.

[73] Assignee: Motorola Inc., Austin, Tex.

[21] Appl. No.: 08/780,117

[22] Filed: Dec. 26, 1996

[51] Int. Cl.$^6$ .................................................. G01R 19/165
[52] U.S. Cl. ........................ 364/528.28; 364/528.27; 364/528.33; 702/57; 702/60; 702/64; 702/193; 327/77; 327/78; 326/80
[58] Field of Search .................. 364/528.28, 528.27, 364/528.32, 528.33, 707; 365/226, 189.09, 189.11, 189.12, 191, 229; 327/56, 77, 78, 143, 545; 326/62, 63, 80, 35; 323/274, 282–284, 299, 313; 307/112, 113, 115, 130, 139, 140; 702/57, 64, 60, 124, 189, 193; 395/750.03, 750.07, 750.08, 182.12, 182.2, 182.21; 324/713

[56] References Cited

U.S. PATENT DOCUMENTS

| | | | |
|---|---|---|---|
| 5,382,839 | 1/1995 | Shinohara | 327/545 |
| 5,420,798 | 5/1995 | Lin et al. | 365/189.09 |
| 5,444,663 | 8/1995 | Furuno et al. | 365/226 |
| 5,497,112 | 3/1996 | Hoang | 327/143 |
| 5,675,272 | 10/1997 | Chu | 327/77 |
| 5,781,043 | 7/1998 | Slemmer | 327/78 |

OTHER PUBLICATIONS

Dallas Semiconductor Corporation 1995, DS1232 MicroMonitor Chip (DS 1232S) (1 pg.). (No date with month).
Dallas Semiconductor Corporation 1995, DS1832 3.3 Volt MicroMonitor Chip (DS1832) (1 pg). (No date with month).
Dallas Semiconductor Corporation 1995, DS1836A/B/C/D/ 3.3V/5V MicroManager 1). (DS 1836 A/B/C/D (pg. 1). (No date with month).

*Primary Examiner*—Hal Dodge Wachsman

[57] ABSTRACT

A Voltage Range Detection Circuit (VRDC) (8) determines the supply voltage range of the integrated circuit. In general, voltage detector (10) determines the voltage level of supply voltage $V_{DD}$ and stores the result of this determination in storage (12). Resistor network (14), which receives the stored result, configures itself in the proper resistor configuration for the determined supplied voltage such that a compare signal is generated that represents a Variable Low Voltage Detection (VLVD) switch point. Resistor network (14) outputs this generated VLVD switch point signal to a first input of comparator (18) to be compared with the constant level reference voltage output by voltage reference (16) at a second input of comparator (18). When the output of resistor network (14) drops below the reference voltage provided by voltage reference (16), comparator (18) outputs a reset signal to disable the chip because a low voltage condition has occurred. As will be appreciated, this single circuit implementation eliminates the need to provide multiple low voltage detection circuits to sense each of the possible voltage operating ranges.

20 Claims, 3 Drawing Sheets

DATA PROCESSING SYSTEM HAVING AN AUTO-RANGING LOW VOLTAGE DETECTION CIRCUIT

FIELD OF THE INVENTION

The present invention relates in general to a data processing system, and in particular to an integrated circuit for detecting a supply voltage range.

BACKGROUND OF THE INVENTION

Integrated circuits that are designed to work over multiple power supply voltage ranges often contain sub-circuits that are voltage range sensitive. For example, setting the switch point voltage to the proper level for a Low Voltage Detection (LVD) circuit depends on the supply voltage level. Still another example is that non-volatile memory such as Electronically Erasable Programmable Read Only Memory (EEPROM) requires ramp rate control which controls how fast the internal charge pump pumps. Also, the number of stages required in the charge pump of the EEPROM may vary depending upon the particular supply voltage. Still further, the integrated circuit pad characteristics, such as AC timing and DC characteristics, should be controlled to compensate for supply voltage range to optimize performance.

There are a substantial number of functions such as the LVD on various integrated circuits that must be optimized for the chip's operating voltage. Obviously, a chip that can function over multiple voltage ranges will have to accommodate for this optimization. In the past, the problem was avoided by generating separate chip layouts for each voltage operating range, so that each mask would be optimized for a particular operating range. As will be appreciated, this solution requires separate masks be designed and laid out and separate chips be produced and inventoried for each desired voltage operating range. This complicates the design, production, integration and inventory for both the chip manufacturer producing the different versions of the chip and the system manufacturer that will use the chips. These problems multiply as the number of potential operating ranges, and therefore chip versions, increases.

Another solution used in the prior art is to develop a chip design that can operate at multiple voltage levels. However, such a chip design has required the addition of multiple pins to the chip so that a desired power supply operating range may be programmed. As will be appreciated, these additional pins increase the chip's footprint and board layout. Also, this solution complicates the chip design and user system integration by requiring external control circuitry.

As can be seen, it would be desirable to provide an integrated circuit that enables a chip to automatically configure itself to optimally perform at a given voltage range. Such a circuit would simplify manufacturing, inventory control and integration by not requiring multiple versions of the same integrated circuit chip, and it would not increase chip area by adding pins or require external, multiple supply, control circuitry.

DESCRIPTION OF THE PREFERRED EMBODIMENTS

Figure 1:
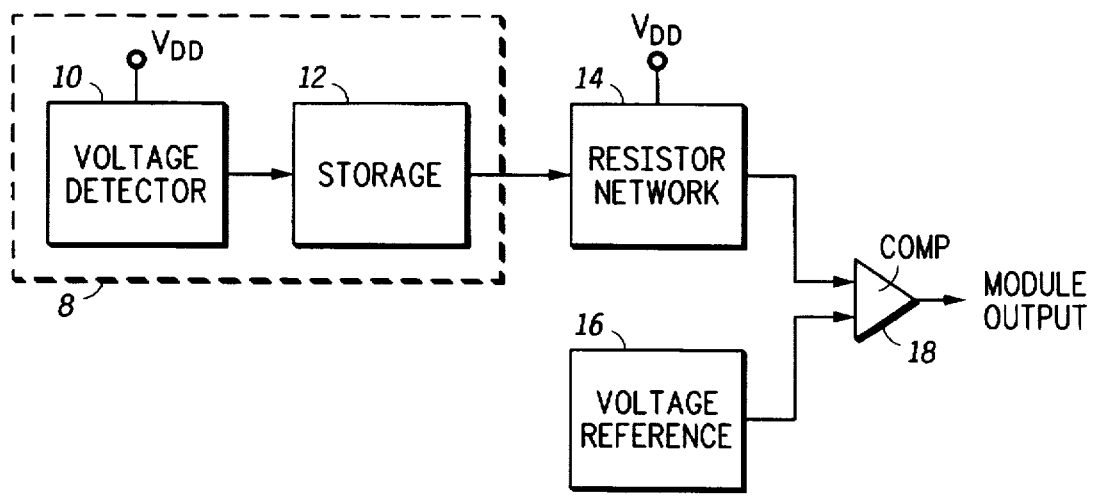
FIG. 1 shows a block diagram of an auto-ranging low voltage detection circuit within an integrated circuit, in accordance with a preferred embodiment of the present invention.

With respect now to the figures, and in particular with respect to FIG. 1, there is shown a block diagram of an auto-ranging low voltage detection circuit within an integrated circuit, in accordance with a preferred embodiment of the present invention. Voltage Range Detection Circuit (VRDC) 8 determines the supply voltage range of the integrated circuit. In general, voltage detector 10 determines the voltage level of supply voltage $V_{DD}$ and stores the result of this determination in storage 12. Resistor network 14, which receives the stored result, configures itself in the proper resistor configuration for the determined supplied voltage such that a compare signal is generated that represents a Variable Low Voltage Detection (VLVD) switch point. Resistor network 14 outputs this generated VLVD switch point signal to a first input of comparator 18 to be compared with the constant level reference voltage output by voltage reference 16 at a second input of comparator 18. When the output of resistor network 14 drops below the reference voltage provided by voltage reference 16, comparator 18 outputs a reset signal to disable the chip because a low voltage condition has occurred. As will be appreciated, this single circuit implementation eliminates the need to provide multiple low voltage detection circuits to sense each of the possible voltage operating ranges.

More particularly, the $V_{DD}$ supply voltage is monitored by voltage detector 10 when the chip is powered on to determine the nominal $V_{DD}$ voltage the chip will operate at for a given session. Once this voltage level has been sampled, it is stored in storage 12 to be used by resistor network 14. The resistor network 14 has multiple configurations corresponding to each of the possible operating supply voltages of the integrated circuit. The appropriate resistor configuration is implemented by resistor network 14 as selected by the stored value in storage 12. The selected configuration of resistor network 14 scales $V_{DD}$ to a standard range to be compared with the voltage reference output by voltage reference 16. A low voltage condition is detected when the supply voltage has decreased below a selected threshold voltage for a given chip supply voltage as indicated by the reset signal output from comparator 18. This low voltage detection can be used for a variety of maintenance or system protection features such as resetting the part to protect against non-volatile memory corruption and system errors.

Figure 2:
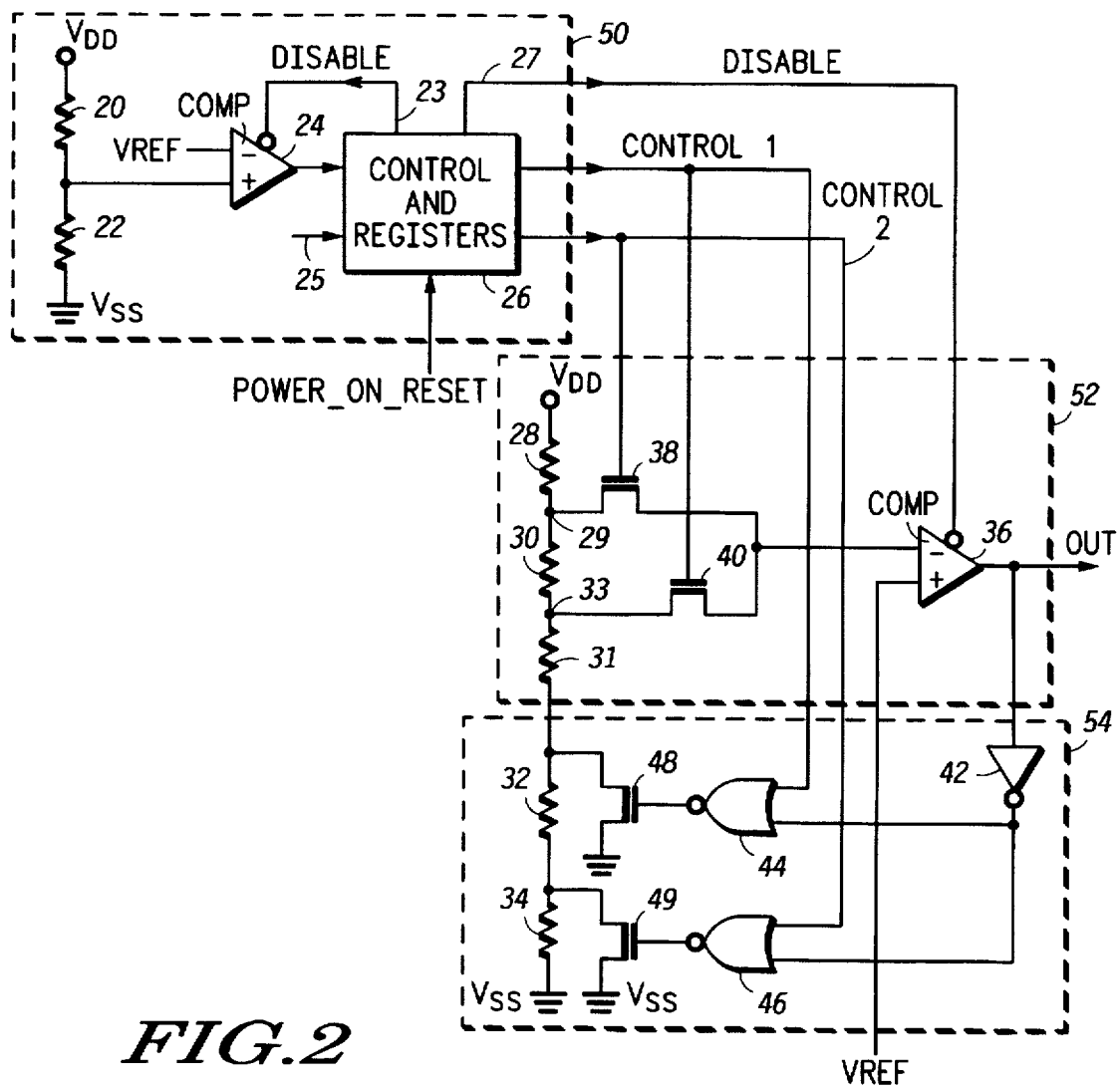
FIG. 2 shows a schematic diagram showing an auto-ranging low voltage detection circuit in accordance with a preferred embodiment of the present invention.

With reference now to FIG. 2, there is shown a schematic diagram showing an auto-ranging low voltage detection circuit in accordance with a preferred embodiment of the present invention. FIG. 2 includes three circuit blocks: a voltage range detection circuit (VRDC) 50 that determines the supply voltage range provided to the chip at $V_{DD}$, a variable low voltage detection circuit (VLVD) 52 that receives the determination as control signals to set the proper VLVD switch point for the current supply voltage range being provided to the chip, and a hysteresis circuit 54 that protects against unstable operation when the VLVD is operating near the VLVD switch point.

The power supply of the chip ($V_{DD}$) is supplied to a first terminal of resistor 20. A second terminal of resistor 20 is connected to a first terminal of resistor 22 and the positive input to comparator 24. A second terminal of resistor 22 is connected to ground. A voltage reference (VREF) is input to the negative terminal of comparator 24. The output of comparator 24 is received by control and registers 26.

As the chip powers up, and the power supply ramps up from 0V to $V_{DD}$, the Power_On_Reset (POR) signal becomes active and clears all configuration registers on the chip, including those in control and registers 26. Once the power supply has reached its operating point and stabilized, the POR signal goes inactive. This change in the POR signal is detected by control and registers 26. At this point, the system clock has not been initiated and control and registers 26 samples the output of comparator 24 and stores the result in a register of control and registers 26. As the voltage ($V_{DD}$) at the first terminal of resistor 20 rises, the voltage at the second terminal of resistor 20 and the positive input to comparator 24 rises. VREF is selected to indicate a threshold voltage that is below what would be the voltage at the positive terminal of comparator 24 for a first power supply voltage and above what would be the voltage level at the positive terminal of comparator 24 for a second supply voltage. Thus, if a positive output from comparator 24 is stored in a register of control and registers 26, a first, higher supply voltage has been applied at $V_{DD}$, and, if a negative output is produced from comparator 24 and stored in the register of control and registers 26, a second, lower power supply voltage has been applied to $V_{DD}$. For example, the circuit could be designed to detect power supply voltages of 3V and 5V.

As will be appreciated, in order to detect more than two power supply voltage ranges beyond the two ranges detected by the circuit embodiment shown in FIG. 2, additional resistors and comparators would be added to VRDC 50, configured as shown for resistors 20, 22 and comparator 24 and connected in series with $V_{DD}$ and set with appropriate resistor values and voltage references to detect those additional voltage ranges, as will be readily determined by those skilled in the art. The outputs of such additional comparators would be input into control and registers 26 at input 25 (or additional inputs not shown). Each additional resistor stack/comparator combination at input 25 would be tuned to detect a different voltage range. As an example of such a preferred embodiment, three power supply voltage ranges could be detected by configuring the VRDC to include three resistors and two comparators connected in combination in a manner similar to resistors 64, 68, 70 and comparators 76, 78 shown in FIG. 3, for example. As will be described in detail below, the output of comparator 76 indicates a first power supply voltage range and the output of comparator 78 indicates a second power supply voltage range, and a third range being detected from a logical comparison of the two outputs.

As seen in FIG. 2, VLVD 52 and hysteresis circuit 54 include series connected resistors 28, 30, 31, 32 and 34 between power supply voltage $V_{DD}$ and ground. Control and registers 26 outputs control signals to switches 38 and 40. These control signals are asserted as a function of the power supply value stored in the register of control and registers 26. If the power supply indicates a first higher power supply level, switch 38 is turned off and switch 40 is turned on. This connects node 33 with the negative input of comparator 36. If the register value indicates a second lower power supply level, the control signals will turn on switch 38 and turn off switch 40, connecting node 29 with the negative input to comparator 36. As will be appreciated by those skilled in the art, the resistor stack 28, 30, 31, 32 and 34 is selected such that the voltage at node 29 will reach the VREF voltage when the supply voltage $V_{DD}$ reaches the VLVD switch point for the second lower supply voltage level. Similarly, resistors 28, 30, 31, 32 and 34 are selected such that the node voltage at 33 will reach the VREF voltage when the supply voltage $V_{DD}$ reaches the VLVD switch point for the first higher supply voltage level. In operation, as the power supply voltage $V_{DD}$ drops down below the VLVD switch point, the corresponding node in the resistor stack connected to the negative terminal of comparator 36 will drop below VREF, setting a positive output from comparator 36. This positive output signal is provided to various other functions within the integrated circuit to indicate a low voltage occurrence.

As will be appreciated, VLVD circuit 52 can be expanded to provide a variable low voltage detection circuit for a multiple power supply chip. This could be accomplished by adding additional resistors in the resistor stack and tapping into the nodes between each resistor to connect with the negative terminal of comparator 36, each tap being switched by a switch controlled by control and registers 26. Control and registers 26 will switch only a single switch corresponding to the power supply level indicated in the power supply register to connect a corresponding node in the series stack with comparator 36. Note that switches 38, 40, 48, and 49 are shown as n-channel transistors in this preferred embodiment but those skilled in the art will appreciate that they may be replaced by any type of switching device such as p-channel transistors or transmission gates whose function is to act as a switch.

A preferred embodiment provides low power features, wherein after the output of comparator 24 has been sampled to determine the power supply voltage, a disable signal 23 is output from control and registers 26 to disable comparator 24 and place it into a low power mode. Similarly, a disable signal 27 is output from control and registers 26 to comparator 36 to disable the comparator and place it in a low power mode when certain low power conditions are needed.

Hysteresis circuit 54 includes inverter 42 receiving the output of comparator 36 and outputting the inverted signal into NOR gates 44, 46. NOR gate 44 receives as a second input CONTROL 1, and NOR gate 46 receives as a second input CONTROL 2. The inverter 42 and NOR gates 44, 46 provide the logic to control switch 48 and switch 49 to short both resistors 32 and 34 or just resistor 34 to create a higher rising VLVD switch point for $V_{DD}$. As will be appreciated, this forces power supply voltage $V_{DD}$ to rise an incrementally higher level than the falling VLVD switch point to prevent oscillation.

Figure 3:
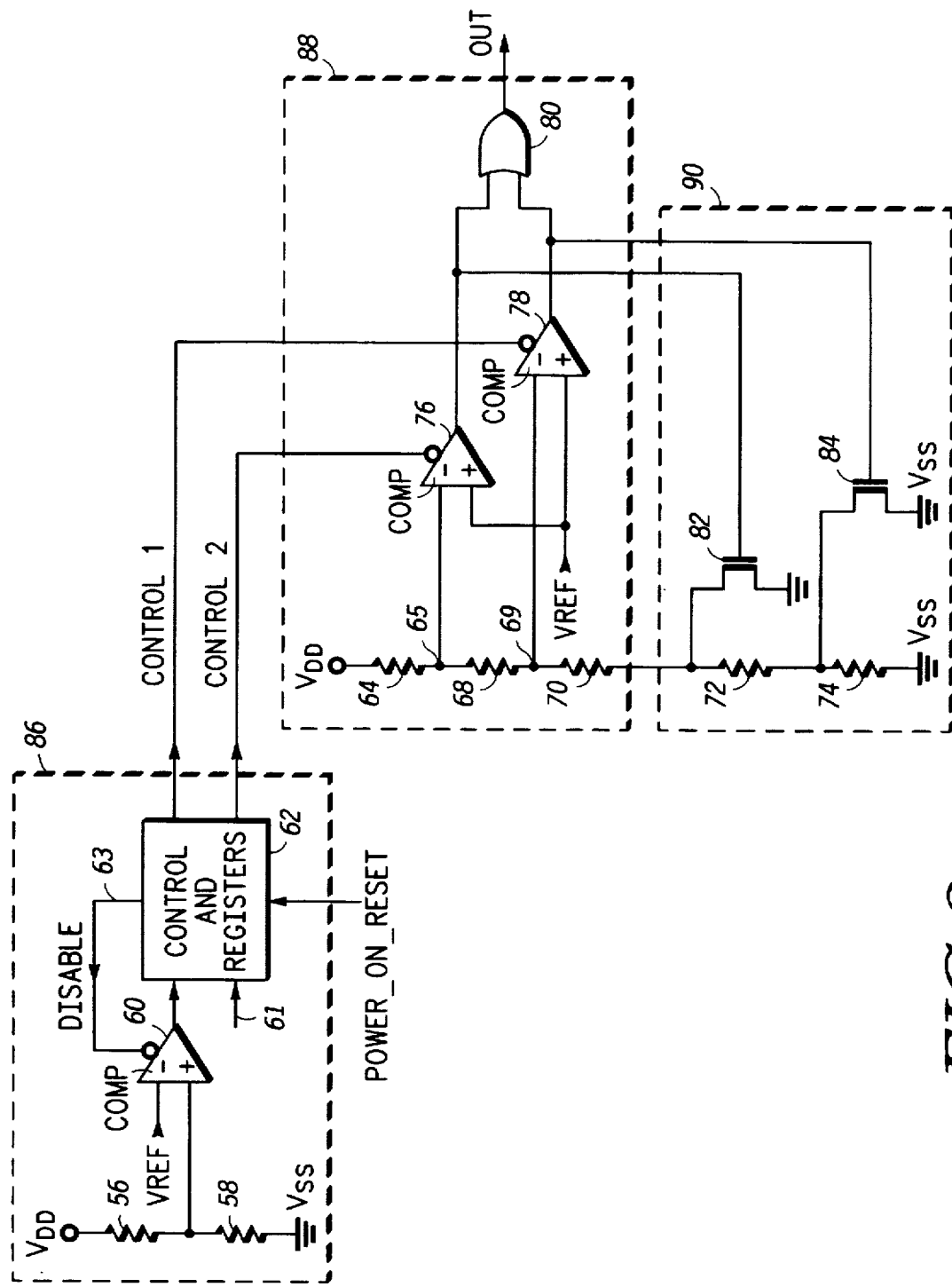
FIG. 3 shows a voltage range detection circuit and variable low voltage detection circuit, in accordance with an alternative preferred embodiment of the present invention.

With reference now to FIG. 3, there is shown a voltage range detection circuit and variable low voltage detection circuit, in accordance with an alternative preferred embodiment of the present invention. Voltage range detection circuit 86 includes resistors 56, 58, comparator 60 and control and registers 62. FIG. 3 includes three circuit blocks: a voltage range detection circuit (VRDC) 86 that determines the supply voltage range provided to the chip at $V_{DD}$, a variable low voltage detection circuit (VLVD) 88 that receives the determination as control signals to set the proper VLVD switch point for the current supply voltage range being provided to the chip, and a hysteresis circuit 90 that protects against unstable operation when the VLVD is operating near the VLVD switch point.

The power supply of the chip ($V_{DD}$) is supplied to a first terminal of resistor 56. A second terminal of resistor 56 is connected to a first terminal of resistor 58 and the positive input to comparator 60. A second terminal of resistor 58 is connected to ground. A voltage reference (VREF) is input to the negative terminal of comparator 60. The output of comparator 60 is received by control and registers 62.

As the chip powers up, and the power supply ramps up from 0V to $V_{DD}$, the Power_On_Reset (POR) signal becomes active and clears all configuration registers on the chip, including those in control and registers 62. Once the power supply has reached its operating point and stabilized, the POR signal goes inactive. This change in the POR signal is detected by control and registers 62. At this point, the system clock has not been initiated and control and registers 62 samples the output of comparator 60 and stores the result in a register of control and registers 62. As the voltage ($V_{DD}$) at the first terminal of resistor 56 rises, the voltage at the second terminal of resistor 56 and the positive input to comparator 60 rises. VREF is selected to indicate a threshold voltage that is below what would be the voltage at the positive terminal of comparator 60 for a first power supply voltage and above what would be the voltage level at the positive terminal of comparator 60 for a second supply voltage. Thus, if a positive output from comparator 60 is stored in a register of control and registers 62, a first, higher supply voltage has been applied at $V_{DD}$, and, if a negative output is produced from comparator 60 and stored in the register of control and registers 62, a second, lower power supply voltage has been applied to $V_{DD}$. For example, the circuit could be designed to detect power supply voltages of 3V and 5V.

As will be appreciated, in order to detect more than two power supply voltage ranges beyond the two ranges detected by the circuit embodiment shown in FIG. 3, additional resistors and comparators would be added to VRDC 86, configured as shown for resistors 56, 58 and comparator 60 and connected in series with $V_{DD}$ and set with appropriate resistor values and voltage references to detect those additional voltage ranges, as will be readily determined by those skilled in the art. The outputs of such additional comparators would be input into control and registers 62 at input 61 (or additional inputs not shown). Each additional resistor stack/comparator combination at input 61 would be tuned to detect a different voltage range. As an example of such a preferred embodiment, three power supply voltage ranges could be detected by configuring the VRDC to include three resistors and two comparators connected in combination in a manner similar to resistors 64, 68, 70 and comparators 76, 78, for example. As will be described in detail below, the output of comparator 76 indicates a first power supply voltage range and the output of comparator 78 indicates a second power supply voltage range, and a third range being detected from a logical comparison of the two outputs. A preferred embodiment provides low power features, wherein after the output of comparator 60 has been sampled to determine the power supply voltage, a disable signal 63 is output from control and registers 62 to disable comparator 60 and place it into a low power mode.

Variable low voltage detection circuit 88 receives CONTROL 1 and CONTROL 2 from VRDC 86, indicating a high power supply voltage or low power supply voltage, respectively. CONTROL 2 is connected to the enable pin of comparator 76 and CONTROL 1 is connected to the enable pin of comparator 78. Resistors 64, 68, 70, 72 and 74 are connected in series in a resistor stack between power supply voltage $V_{DD}$ and ground. Node 65 is connected to the negative input of comparator 76 and node 69 is connected to the negative input of comparator 78. A reference voltage VREF is input to the positive inputs of comparators 76 and 78.

If the power supply indicator stored in the register of control and registers 62 indicates the lower power supply voltage range, CONTROL 2 is asserted by control and registers 62 to enable comparator 76. CONTROL 1 is negated to disable comparator 78. The ratio of resistors 68, 70, 72 and 74 to the total resistor stack comprised of resistors 64, 68, 70, 72 and 74 is set such that, for the low power supply voltage range, the voltage at node 65 will reach the level of VREF when the power supply voltage $V_{DD}$ falls below a predetermined LVD switch point. This will produce a positive output from comparator 76 into OR logic gate 80. Similarly, if the power supply indicator in the register of control and registers 62 indicates the higher power supply voltage, CONTROL 1 is asserted to enable comparator 78 and CONTROL 2 is de-asserted to disable comparator 76. The ratio of resistors 70, 72 and 74 to the total resistor stack comprised of 64, 68, 70, 72 and 74 are selected such that the voltage at node 69 will reach the reference voltage VREF at the point that the power supply voltage $V_{DD}$ falls below the LVD switch point required for the higher level power supply voltage. When such a "low voltage" condition occurs, the output of comparator 78 switches positive at the input of OR logic gate 80. Note that both CONTROL 1 and CONTROL 2 are negated to disable both comparators 76 and 78 if a low current sleep condition is desired.

The output of OR logic gate 80 is used as a reset signal (LVD output signal) to reset the integrated circuit when the variable low voltage detection circuit detects a low voltage condition. This LVD output signal could be output directly to various circuit blocks within the integrated circuit or, alternatively, it could be stored as a register bit that is read by a processor or other logic functions to detect the low voltage condition. As those skilled in the art will appreciate, the output logic for combining comparator output signals can be implemented in various ways. For example, OR logic gate 80 could be implemented using a NAND gate array receiving the comparator outputs and control signals from control and registers 62.

In a similar manner to the embodiment of FIG. 2, the VRDC 86 (shown in FIG. 3 ) can detect multiple power supply ranges, and supply a corresponding control signal to VLVD circuit 88 for each possible power supply range. VLVD circuit 88 would be expanded to further include an additional resistor and comparator for each additional power supply voltage range that may be detected by VRDC 86. The negative input to each additional comparator will be connected to a node of the resistor stack and the positive input to the comparator connected to VREF, wherein the ratio of resistors below the connection node to the sum of all resistors in the resistor stack will set the voltage at that node equal to VREF at the point that the corresponding power supply voltage connected at $V_{DD}$ reached the VLVD switch point for that particular power supply voltage range. Control and registers 62 would provide a control signal to enable the comparator corresponding to the detected power supply voltage range, which will output a positive output signal to OR logic gate 80 when the low voltage condition is detected. This produces a low voltage detect output signal OUT from OR logic gate 80 that is used to reset the integrated circuit or set a low voltage status bit in a register.

Hysteresis circuit 90 includes switches 82, 84 and resistors 72, 74. Switch 82 is controlled by the output of comparator 76 and switch 84 is controlled by the output of comparator 78. If a low power supply has been detected and CONTROL 2 has enabled comparator 76, a detected low voltage condition will set the output of comparator 76 high to turn on switch 82, which shorts out resistors 72 and 74. If a high voltage power supply condition is detected and CONTROL 1 enables comparator 78, a detected low voltage condition will set the output of comparator 78 high to turn on switch 84, which shorts out resistor 74. Hysteresis circuit 90 prevents a voltage oscillation of the output signal OUT of the VLVD 88 of FIG. 3 or VLVD 52 of FIG. 2 when a voltage provided to the comparators of the VLVD circuits is relatively near a trip point of the comparators. Note that switches 82 and 84 are shown as n-channel transistors in this preferred embodiment but those skilled in the art will appreciate that they may be replaced by any type of switching device such as p-channel transistors or transmission gates whose function is to act as a switch.

Figure 4:
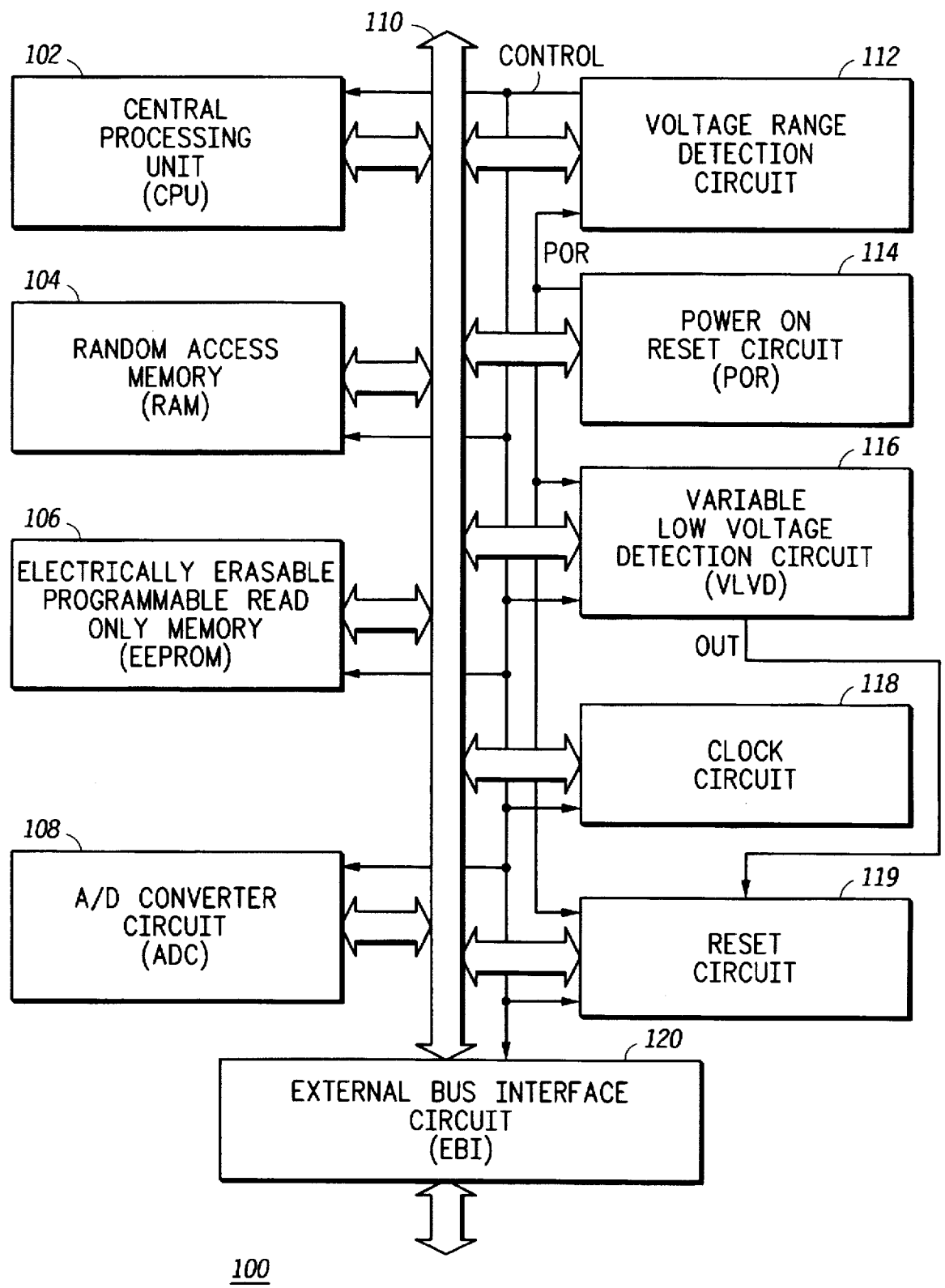
FIG. 4 illustrates a data processing system 100 in accordance with a preferred embodiment of the present invention.

FIG. 4 illustrates a data processing system 100 in accordance with a preferred embodiment of the present invention. Data processing system 100 includes a voltage range detection circuit and auto-ranging circuit blocks that switch or control supply voltage sensitive functions within each circuit. The data processing system 100 includes a central processing unit (CPU) 102, a random access memory (RAM) 104, an electrically erasable programmable read only memory (EEPROM) 106, an analog-to-digital converter circuit (ADC) 108, a voltage range detection circuit (VRDC) 112, a power on reset circuit (POR) 114, a variable low voltage detection circuit (VLVD) 116, clock circuit 118, reset circuit 119, and external bus interface circuit (EBI) 120, all bidirectionally interconnected via bus 110. As shown in FIG. 4, VRDC 112 outputs one or more control signals to devices 102, 104, 106, 108, 116, 118, 119 and 120. As described herein above, VRDC 112 operates identically to VRDC 8, 50 and 86 (shown in FIGS. 1, 2, and 3, respectively) to provide control signals to various system components so that they may optimize supply voltage sensitive circuits to the chip's power supply voltage as detected by VRDC 112. In one embodiment of the present invention, a second register of control and registers 62 may be accessed by the CPU to allow a user to adjust a voltage range of the predetermined power supply voltage ranges as discussed above in the description of FIGS. 2 and 3.

During start-up of data processing system 100, the power supply voltage ($V_{DD}$) is provided to data processing system 100 having a controlled ramp rate. POR circuit 114 monitors the application of $V_{DD}$ to data processing system 100. If $V_{DD}$ is below the POR voltage threshold then POR circuit 114 asserts a power-on-reset signal to place data processing system 100 into reset. When it is determined that $V_{DD}$ is both above the POR voltage threshold and stable, POR circuit 114 terminates a power-on-reset signal labeled "POR" to voltage range detection circuit 112, VLVD 116, and reset circuit 119. VRDC 112 and VLVD 116 are then activated to detect and determine which predetermined power supply range data processing system 100 is to operate in, for example, 3.3 volts plus or minus 10 percent. VRDC 112 and VLVD 116 operate at a time when it is determined that the power supply voltage will be the "quietest", that is, when a minimum amount of circuit operation is occurring. In the illustrated embodiment, the "quietest" period is immediately after the POR signal is negated, but before the system clocks of clock circuit 118 begin functioning. In other embodiments, the time when VRDC 112 and VLVD 116 operate may be different. VLVD 116 provides a control signal to RESET circuit 119. In response to control signal being asserted to indicate a low power supply voltage, RESET circuit 119 provides a reset signal to the other circuit blocks of data processing system 100, via the bidirectional bus 110.

Output signal CONTROL from VRDC 112 may be used to configure many aspects of data processing system 100 for operation at more than one supply voltage. As an example, EEPROM 106 can control its charge pump ramp rate based on the indicated supply voltage level. In addition, the number of stages used in the charge pump of the EEPROM 106 can be set as a function of the VRDC CONTROL signal. Further, the VRDC CONTROL signal can be used to control amplifiers in the ADC 108 to compensate for the current supply voltage. Still further, the AC parameters of clock circuit 118 can be adjusted based on the supply voltage, as indicated by the VRDC 112.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An auto-ranging low voltage detection circuit comprising:

a first comparator for comparing a first voltage to a first reference voltage, and in response to the first voltage being higher than the first reference voltage, the first comparator providing a logic signal having a first logic state, and in response to the first voltage being lower than the first reference voltage, the first comparator providing the logic signal having a second logic state; and a variable low voltage detection circuit for receiving the logic signal and a power supply voltage, wherein the variable low voltage detection circuit automatically configures to a first configuration of a plurality of configurations to detect a low voltage condition for a particular power supply voltage of a plurality of power supply voltages in response to the logic signal and provides an output signal for indicating if the first voltage is within a first predetermined range as specified by the first configuration when the logic signal has the first logic state, and provides the output signal for indicating if the first voltage is within a second predetermined range as specified by the first configuration when the logic signal has the second logic state.

2. The auto-ranging low voltage detection circuit of claim 1, wherein the variable low voltage detection circuit comprises:

a plurality of series-connected resistive elements coupled between a first power supply voltage terminal and a second power supply voltage terminal;

a second comparator having a first input terminal coupled at a first predetermined point of the plurality of series-connected resistive elements, a second input terminal for receiving a second reference voltage, a control terminal coupled to a storage element, and an output terminal;

a third comparator having a first input terminal coupled at a second predetermined point of the plurality of series-connected resistive elements, a second input terminal for receiving the second reference voltage, a control terminal coupled to the storage element, and an output terminal; and a logic circuit, having first and second input terminals coupled to the output terminals of the second and third comparators, and an output terminal for providing the output signal.

3. The auto-ranging low voltage detection circuit of claim 2, further comprising a hysteresis circuit, coupled to the variable low voltage detection circuit, for preventing oscillation of the output signal when a voltage provided to the first input terminals of the second and third comparators is relatively near a trip point of the second and third comparators.

4. The auto-ranging low voltage detection circuit of claim 2, wherein the variable low voltage detection circuit comprises:

- a plurality of series-connected resistive elements coupled between a first power supply voltage terminal and a second power supply voltage terminal;
- a first switch having an input terminal coupled at a first predetermined point of the plurality of series-connected resistive elements, a control terminal coupled to the storage element, and an output terminal;
- a second switch having an input terminal coupled at a second predetermined point of the plurality of series-connected resistive elements, a control terminal coupled to the storage element, and an output terminal; and
- a second comparator having a first input terminal coupled to the output terminals of the first and second switches, a second input terminal for receiving a second reference voltage, and an output terminal for providing the output signal.

5. The auto-ranging low voltage detection circuit of claim 4, further comprising a hysteresis circuit, coupled to the variable low voltage detection circuit, for preventing oscillation of the output signal when a voltage provided to the first input terminal of the second comparator is relatively near a trip point of the second comparator.

6. The auto-ranging low voltage detection circuit of claim 5, wherein the first comparator is disabled after the logic state of the logic signal has been stored in the storage element.

7. The auto-ranging low voltage detection circuit of claim 1, wherein the first comparator is not activated until after a power on reset signal indicates that the power supply voltage is stable.

8. The auto-ranging low voltage detection circuit of claim 1, wherein the first voltage directly corresponds to the power supply voltage.

9. The auto-ranging low voltage detection circuit of claim 1, further comprising a storage element, coupled to the first comparator, the storage element for storing the first or second logic states of the logic signal.

10. A data processing system comprising:

- a central processing unit (CPU) for executing instructions;
- a bus coupled to the central processing unit;
- a voltage detection circuit, coupled to the bus, the voltage detection circuit, comprising:
  - a first comparator for comparing a first voltage to a first reference voltage, and in response to the first voltage being higher than the first reference voltage, the first comparator providing a logic signal having a first logic state, and in response to the first voltage being lower than the first reference voltage, the first comparator providing the logic signal having a second logic state; and
  - a register, coupled to the first comparator and to the bus, for storing the first and second logic states of the logic signal, wherein the register is accessible by the CPU via the bus; and
- a variable low voltage detection circuit, coupled to the register, the variable low voltage detection circuit for receiving the logic signal and a power supply voltage, wherein the variable low voltage detection circuit automatically configures to detect a low voltage condition for a particular power supply voltage of a plurality of power supply voltages in response to the logic signal and provides an output signal for indicating if the first voltage is within a first predetermined range as specified by a first configuration when the logic signal has the first logic state, and provides the output signal for indicating if the first voltage is within a second predetermined range as specified by the first configuration when the logic signal has the second logic state.

11. The data processing system of claim 10, wherein the variable low voltage detection circuit comprises:

- a plurality of series-connected resistive elements coupled between a first power supply voltage terminal and a second power supply voltage terminal;
- a second comparator having a first input terminal coupled at a first predetermined point of the plurality of series-connected resistive elements a second input terminal for receiving a second reference voltage, a control terminal coupled to the register, and an output terminal;
- a third comparator having a first input terminal coupled at a second predetermined point of the plurality of series-connected resistive elements, a second input terminal for receiving the second reference voltage, a control terminal coupled to the register, and an output terminal; and
- a logic circuit, having first and second input terminals coupled to the output terminals of the second and third comparators, and a output terminal for providing the output signal.

12. The data processing system of claim 11, further comprising a hysteresis circuit, coupled to the variable low voltage detection circuit, for preventing oscillation of the output signal when a voltage provided to the first input terminals of the second and third comparators is relatively near a trip point of the second and third comparators.

13. The data processing system of claim 10, wherein the variable low voltage detection circuit comprises:

- a plurality of series-connected resistive elements coupled between a first power supply voltage terminal and a second power supply voltage terminal;
- a first switch having an input terminal coupled at a first predetermined point of the plurality of series-connected resistive elements, a control terminal coupled to the register, and an output terminal;
- a second switch having an input terminal coupled at a second predetermined point of the plurality of series-connected resistive elements, a control terminal coupled to the register, and an output terminal; and
- a second comparator having a first input terminal coupled to the output terminals of the first and second switches, a second input terminal for receiving a second reference voltage, and an output terminal for providing the output signal.

14. The data processing system of claim 13, further comprising a hysteresis circuit, coupled to the variable low voltage detection circuit, for preventing oscillation of the output signal when a voltage provided to the first input terminal of the second comparator is relatively near a trip point of the second comparator.

15. The data processing system of claim 10, wherein the first comparator is disabled after a logic state of the logic signal has been stored in the register.

16. The data processing system of claim 10, wherein the first comparator is not activated until after a power on reset signal indicates that the power supply voltage is stable.

17. The data processing system of claim 10, wherein the first voltage directly corresponds to the power supply voltage.

18. The data processing system of claim 10, further comprising a second register, coupled to the CPU and to the variable low voltage detection circuit, for allowing the CPU to adjust a voltage range of the first and second predetermined ranges.

19. A data processing system having an auto-ranging low voltage detection circuit, the auto-ranging low voltage detection circuit comprising:

a voltage detection circuit, coupled to a bus, the voltage detection circuit, comprising:

a first comparator for comparing a first voltage to a first reference voltage, and in response to the first voltage being higher than the first reference voltage, the first comparator providing a logic signal having a first logic state, and in response to the first voltage being lower than the first reference voltage, the first comparator providing the logic signal having a second logic state; and a register, coupled to the first comparator and to the bus, the register for storing the first or second logic states of the logic signal;

wherein the register is accessible by the data processing system via the bus; and a variable low voltage detection circuit, comprising:

a plurality of series-connected resistive elements coupled between a first power supply voltage terminal and a second power supply voltage terminal;

a second comparator having a first input terminal coupled at a first predetermined point of the plurality of series-connected resistive elements, a second input terminal for receiving a second reference voltage, a control terminal coupled to the register, and an output terminal;

a third comparator having a first input terminal coupled at a second predetermined point of the plurality of series-connected resistive element, a second input terminal for receiving the second reference voltage, a control terminal coupled to the register, and an output terminal; and a logic circuit, having first and second input terminals coupled to the output terminals of the second and third comparators, and an output terminal for providing an output signal.

20. A data processing system having an auto-ranging low voltage detection circuit, the auto-ranging low voltage detection circuit comprising:

a voltage detection circuit, coupled to a bus, the voltage detection circuit, comprising:

a first comparator for comparing a first voltage to a first reference voltage, and in response to the first voltage being higher than the first reference voltage, the first comparator providing a logic signal having a first logic state, and in response to the first voltage being lower than the first reference voltage the logic signal having a second logic state; and a register, coupled to the first comparator and to the bus, the register for storing the first or second logic states of the logic signal;

wherein the register is accessible by the data processing system via the bus; and a variable low voltage detection circuit, comprising:

a plurality of series-connected resistive elements coupled between a first power supply voltage terminal and a second power supply voltage terminal;

a first switch having an input terminal coupled at a first predetermined point of the plurality of series-connected resistive elements a control terminal coupled to the register, and an output terminal;

a second switch having an input terminal coupled at a second predetermined point of the plurality of series-connected resistive elements, a control terminal coupled to the register, and an output terminal; and a second comparator having a first input terminal coupled to the output terminals of the first and second switches, a second input terminal for receiving a second reference voltage, and an output terminal for providing an output signal.

* * * * *